(12) United States Patent
Drewery et al.

(10) Patent No.: US 6,197,165 B1
(45) Date of Patent: *Mar. 6, 2001

(54) METHOD AND APPARATUS FOR IONIZED PHYSICAL VAPOR DEPOSITION

(75) Inventors: John S. Drewery; Thomas J. Licata, both of Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/261,934

(22) Filed: Mar. 3, 1999

Related U.S. Application Data

(63) Continuation-in-part of application No. 09/073,141, filed on May 6, 1998.

(51) Int. Cl.[7] .................................................. C23C 14/34

(52) U.S. Cl. .............................. 204/192.12; 204/298.26; 204/298.11; 204/298.19; 204/298.16; 204/298.08; 204/298.12

(58) Field of Search .................. 204/298.26, 198.11, 204/298.19, 298.16, 298.08, 298.11, 298.12, 192.12

(56) References Cited

U.S. PATENT DOCUMENTS

| | | | |
|---|---|---|---|
| 4,415,427 | * 11/1983 | Hidler et al. | 204/298.26 |
| 4,721,553 | 1/1988 | Saito et al. | 204/192.12 |
| 4,844,775 | 7/1989 | Keeble | 204/192.23 |
| 4,911,814 | 3/1990 | Matsuoka et al. | 204/298.17 |
| 4,948,458 | 8/1990 | Ogle | 204/298.03 |
| 4,990,229 | 2/1991 | Campbell et al. | 204/298.06 |
| 5,069,770 | 12/1991 | Glocker | 204/192.12 |
| 5,178,739 | 1/1993 | Barnes et al. | 204/192.12 |
| 5,728,280 | 3/1998 | Scherer | 204/298.18 |
| 5,800,688 | * 9/1998 | Lanstmann et al. | 204/298.08 |
| 5,865,961 | * 2/1999 | Yokoyama et al. | 204/298.16 |

FOREIGN PATENT DOCUMENTS

| | | | |
|---|---|---|---|
| 195 06 513 | 8/1996 | (DE) | H01J/37/34 |
| 0 593 924 A1 | 4/1994 | (EP) | H01J/37/32 |
| 0 782 172 A2 | 7/1997 | (EP) | H01J/37/32 |
| 0836 218 A2 | 4/1998 | (EP) | H01J/37/34 |
| 61-190070 | 8/1986 | (JP) | C23C/14/34 |

OTHER PUBLICATIONS

U.S. application No. 09/253116, Vukovic, filed Feb. 1999.*

U.S. application No. 09/073141, Drewery et al., filed Feb. 1999.*

* cited by examiner

Primary Examiner—Nam Nguyen
Assistant Examiner—Deborah Chacko-Davis
(74) Attorney, Agent, or Firm—Wood, Herron & Evans, L.L.P.

(57) ABSTRACT

Ionized physical vapor deposition (IPVD) is provided by a method of apparatus for sputtering coating material from a compound sputtering source formed of an annular ring-shaped target with a circular target at its center, increasing deposition rate and coating uniformity. Each target is separately energized to facilitate control of the distribution of material sputtered into the chamber and the uniformity of the deposited film. The sputtered material from the targets is ionized in a processing space between the target and a substrate by generating a dense plasma in the space with energy coupled from a coil located outside of the vacuum chamber behind an annular dielectric window in the chamber wall in the central opening of the annular target and surrounding the circular target. A Faraday type shield physically shields the window to prevent coating material from coating the window, while allowing the inductive coupling of energy from the coil into the processing space.

17 Claims, 2 Drawing Sheets

METHOD AND APPARATUS FOR IONIZED PHYSICAL VAPOR DEPOSITION

This is a continuation-in-part of U.S. patent application Ser. No. 09/073,141, of John S. Drewery and Thomas J. Licata, inventors herein, filed May 6, 1998, now U.S. Pat. No. 6,080,287 entitled Method and Apparatus for Ionized Physical Vapor Deposition, hereby expressly incorporated by reference herein.

FIELD OF THE INVENTION

This invention relates to Ionized Physical Vapor Deposition and, more particularly, to methods and apparatus by which coating material is supplied in a vapor state and ionized to improve the directionality and uniformity of the deposition of the coating material onto substrates.

BACKGROUND OF THE INVENTION

Ionized physical vapor deposition is a process which has particular utility in filling and lining high aspect ratio structures on silicon wafers. In ionized physical vapor deposition (IPVD) used for the deposition of thin coatings on semiconductor wafers, materials to be deposited are sputtered or otherwise vaporized from a usually solid source and then a substantial fraction of the vaporized material is converted to positive ions before reaching the wafer to be coated. This ionization is accomplished by a high density plasma which is generated in a process gas in a vacuum chamber. The plasma may be generated by reactively (capacitively or inductively) coupling RF energy from an RF powered excitation element into the vacuum processing chamber. Such a plasma may be produced, for example, by inductively coupling RF energy from a coil to produce an inductively coupled plasma (ICP) within the chamber.

To ionize the coating material, the dense plasma is generated in a region between the source and the wafer. When sputtered material passes through the region containing the dense plasma, a substantial fraction of the material becomes ionized. Once the material is ionized, electromagnetic forces applied to the ionized coating material, such as by applying a negative bias on the wafer, attract positive ions of the coating material toward the wafer. Such a negative bias may either arise with the wafer electrically isolated by reason of the immersion of the wafer in a plasma or by the application of an RF voltage to the wafer or wafer support. The bias potential causes ions of coating material to be accelerated toward the wafer, which increases the fraction of the coating material that arrives at the surface of the wafer at angles that are approximately normal to the wafer. This allows deposition of metal over wafer topography such as deep and narrow holes and trenches on the wafer surface, providing coverage of the bottoms and sidewalls of such topography.

Certain IPVD systems proposed by the assignee of the present application are disclosed in: U.S. patent application Ser. Nos. 08/844,751 entitled Method and Apparatus for Ionized Sputtering; 08/837,551 entitled Apparatus for Ionized Sputtering, now U.S. Pat. No. 5,800,688; and 08/844,756 entitled Apparatus for Ionized Sputtering of Materials. Each of these applications were filed on Apr. 21, 1997 and each is hereby expressly incorporated by reference herein. Such systems include a vacuum chamber which is typically cylindrical in shape and provided with part of its curved outer wall formed of a dielectric material or window. A helical electrically conducting coil is disposed outside the dielectric window and around, and concentric with, the chamber, with the axial extent of the coil being a significant part of the axial extent of the dielectric wall. In operation, the coil is energized from a supply of RF power through a suitable matching system. The dielectric window allows the energy from the coil to be coupled into the chamber while isolating the coil from direct contact with the plasma. The window is protected from metal coating material deposition by an arrangement of shields, typically formed of metal, which are capable of passing RF magnetic fields into the interior region of the chamber while preventing deposition of metal onto the dielectric window that would tend to form conducting paths for circulating currents generated by these magnetic fields. Such currents are undesirable because they lead to ohmic heating and to reduction of the magnetic coupling of plasma excitation energy from the coil to the plasma. The purpose of this excitation energy is to generate high density plasma in the interior region of the chamber. A reduction of coupling causes plasma densities to be reduced and process results to deteriorate.

In such IPVD systems, material is, for example, sputtered from a target, which is charged negatively with respect to a high energy sputtering plasma formed close to the target, usually by means of a DC power supply connected between the target and a chamber anode such as the grounded chamber wall. The target is often of a planar magnetron design incorporating a magnetic circuit or other magnet structure which confines the sputtering plasma over the target for sputtering the target. The material arrives at a wafer supported on a wafer support or table to which a negative bias is typically applied by means of an RF power supply connected through a matching network to the substrate support.

A somewhat different geometry employs a plasma generated by a coil placed internal to the vacuum chamber. Such a system does not require dielectric chamber walls or special shields to protect the dielectric walls. Such a system is described by Barns et al. in U.S. Pat. No. 5,178,739, expressly incorporated by reference herein. Systems with coils outside of the chamber, as well as systems of the type disclosed in the Barnes et al. patent, involve the use of inductive coils or other reactive coupling elements, either inside or external to the vacuum, that are physically positioned and occupy space between the planes of the sputtering target and the wafer.

Whether a coupling element such as a coil is provided inside or outside of a vacuum chamber, dimensions of the system are constrained by the need for adequate source-to-substrate separation to allow for the installation of the RF energy coupling elements between the source and the substrate. Adequate diameter must also be available around the wafer for installation of coils or other coupling elements. As a direct result of the increased source-to-substrate spacing due to the need to allow space for the coupling element, it is difficult to achieve adequate uniformity of deposition with such systems. If the height of the chamber is reduced to improve uniformity, there is a loss of plasma density in the central region of the chamber and the ionization percentage of the coating material is reduced. Also, in practice, the entire system must fit within a constrained radius. As a result, there are frequently problems due to heating arising from the proximity of the RF coils to metal surfaces, which may necessitate extra cooling, which increases engineering and production costs and wastes power.

An IPVD apparatus with the coil in the chamber has the additional disadvantage that the coils are eroded by the plasma and must, therefore, consist of target grade material of the same type as that of which the target is made. Moreover, considerable cooling of coils placed in the vacuum chamber is needed. If liquid is used for this cooling of the coils, there is danger that the coils will be penetrated by uneven erosion or by arcing, causing a resulting leak of liquid into the system, which is highly undesirable and will likely result in a long period of cleaning and requalification of the system. Furthermore, an excitation coil in the chamber also couples capacitively to the plasma, leading to inefficient use of the excitation power and to the broadening of the ion energy spectrum, which may have undesirable effects on the process.

As a result of the above considerations and problems, there remains a need for more efficiently coupling energy into the dense coating material ionizing plasma in IPVD processing systems, and to do so without interfering with the optimum dimensions of the chamber and, preferably, without placing a coil or other coupling element into the vacuum chamber. Furthermore, the solution to these problems must further provide uniformity of the deposited film on the substrate.

SUMMARY OF THE INVENTION

One objective of the present invention is to provide an IPVD method and an IPVD apparatus in which the placement of the coil or other coupling element does not adversely affect the geometry of the chamber of the processing apparatus. Another objective of the present invention is to provide an IPVD method and an IPVD apparatus in which the placement of the coil or other coupling element does not adversely affect the uniformity of the deposited film on the substrate. A still further objective of the present invention is to provide a more efficient and effective method and apparatus for the performance of IPVD.

According to the principles of the present invention, an IPVD apparatus is provided with a ring-shaped source of coating material having a central opening at its center with a central source of coating material that matches the material of the ring-shaped source situated in the opening, preferably at the center. The sources produce a vapor formed of atoms and minute particles of the coating material in a processing space within a vacuum chamber. An annular coupling element is provided at the central opening of the ring-shaped source surrounding the central source. The coupling element operates to reactively couple RF energy into the chamber to produce a high density, reactively coupled plasma in the processing space. The high density plasma ionizes coating material passing through the processing space. The ions of coating material drift toward a substrate, which is supported in the chamber at the opposite end of the processing space from the source, in paths influenced by electrostatic or electromagnetic fields that are present in the processing space. Ions that arrive within a certain distance of the substrate, for example, in the order of a centimeter from the substrate, encounter a sheath field and are accelerated toward the substrate by the potential between the plasma and the substrate. As a result, a high percentage of the coating material arrives on the substrate at angles normal to the substrate, thereby more effectively lining the bottoms and sides of, or filling, small and high aspect ratio features on the surface of the substrate.

In accordance with certain objectives of the invention, an IPVD apparatus and method are preferably provided with two independently powered metal sputtering targets, a coil and a Faraday shield, concentrically arranged. One target is a central circular plate. The Faraday shield is annular and surrounds the plate. The second target is also annular and surrounds the Faraday shield. The coil is situated behind the shield and couples RF energy through the shield into the processing space. The Faraday shield and coil are optimized to work in cooperation with the two concentric targets to deliver coating material to the substrate at high deposition rates and with uniformity that can be optimized through adjustment of the relative powers to the targets.

In a preferred embodiment of the invention, a coating material source, preferably including a ring-shaped sputtering target, is provided with an annular dielectric window placed in its central opening. Behind the window, outside the vacuum of the chamber, is located a ring-shaped plasma source which includes a coupling element. The element is connected to the output of an RF energy source. The coupling element is preferably a coil configured to inductively couple energy supplied from the energy source through the window at the opening at the center of the ring-shaped material source and into the region of the chamber between the coating material source and the substrate on a substrate support at the opposite end of the chamber from the coating material source.

In accordance with the preferred embodiment, the coating material source includes a central source, preferably, a circular sputtering target, situated in the center of the annular window to provide coating material that originates from the center of the source. The central source cooperates with the ring-shaped source to provide a uniform flux of material onto the substrate and particularly, supplements the coating of the sides of features on the substrate that face radially inward toward a central axis of the chamber on which the substrate and source are centered.

Preferably, the apparatus of the present invention includes an annular sputtering target and a central sputtering target between which is the annular dielectric window that seals an opening in the wall of the chamber. Behind the window is a coil or other coupling element. In certain preferred embodiments, the annular and central targets are flat or nearly flat and lie in a common plane. A magnetron magnet assembly is preferably positioned behind the targets to produce a plasma confining magnetic field over the targets. the magnet assembly preferably includes an annular magnetic tunnel over the ring-shaped target. The targets are simultaneously energized with a negative voltage, which are preferably produced by a DC or pulsed DC power supply. High energy sputtering plasma is generated, which is generally confined to the surfaces of the targets, to sputter material from the targets. Separate DC power supplies for each of the targets allow the relative sputtering rates of the targets to be separately controlled.

The coupling element is preferably a coil positioned behind and close to the back, outside surface of the dielectric window at the central opening of an annular sputtering target. RF energy of, for example, 13.56 MHZ, is applied to the coil to excite a high density inductively coupled plasma in the chamber between the targets and the substrate. The main sputtering plasma, which is trapped under a field of the magnetron magnets at the surfaces of the targets, sputters coating material from the targets and into the region of the processing space occupied by the dense secondary plasma, where a substantial portion of the material is stripped of electrons to form positive ions of the coating material. A negative bias voltage applied to a wafer on the substrate holder attracts the positive ions of sputtering material from the region of the secondary plasma and toward and onto the surface of the substrate. The angles of incidence of the material arriving on the substrate are nearly perpendicular to the substrate and enter holes and trenches on the substrate surface to coat the bottoms of these holes and trenches. The central target provides increased material to the radially inward facing sides of the features, enhancing the uniformity of the film. The relative powers applied to the targets are separately adjusted to achieve uniform coverage on the substrate. These powers are readjusted over the life of the target to maintain uniformity as the target erodes or as other parameters change.

According to the apparatus of the invention, the processing chamber is dimensioned to provide optimum spacing between the coating material source and the substrate to provide both optimal ionization of sputtered species as well as optimal uniformity of deposition on the wafers.

The present invention provides greater freedom of design choice in configuring the processing chamber to optimize the IPVD process and does so while overcoming the difficulties set forth in the background above, providing a uniform film on substrates having sub-micron sized high aspect ratio features thereon. In particular, the present invention achieves higher deposition rates, better flat field uniformity and more uniform step coverage on recessed features than systems of the prior art. These benefits allow the source to be conveniently used for flat field depositions as well as for step coverage and fill depositions.

These and other objectives and advantages of the present invention will be more readily apparent from the following detailed description of the drawings.

DETAILED DESCRIPTION OF THE INVENTION

Figure 1:
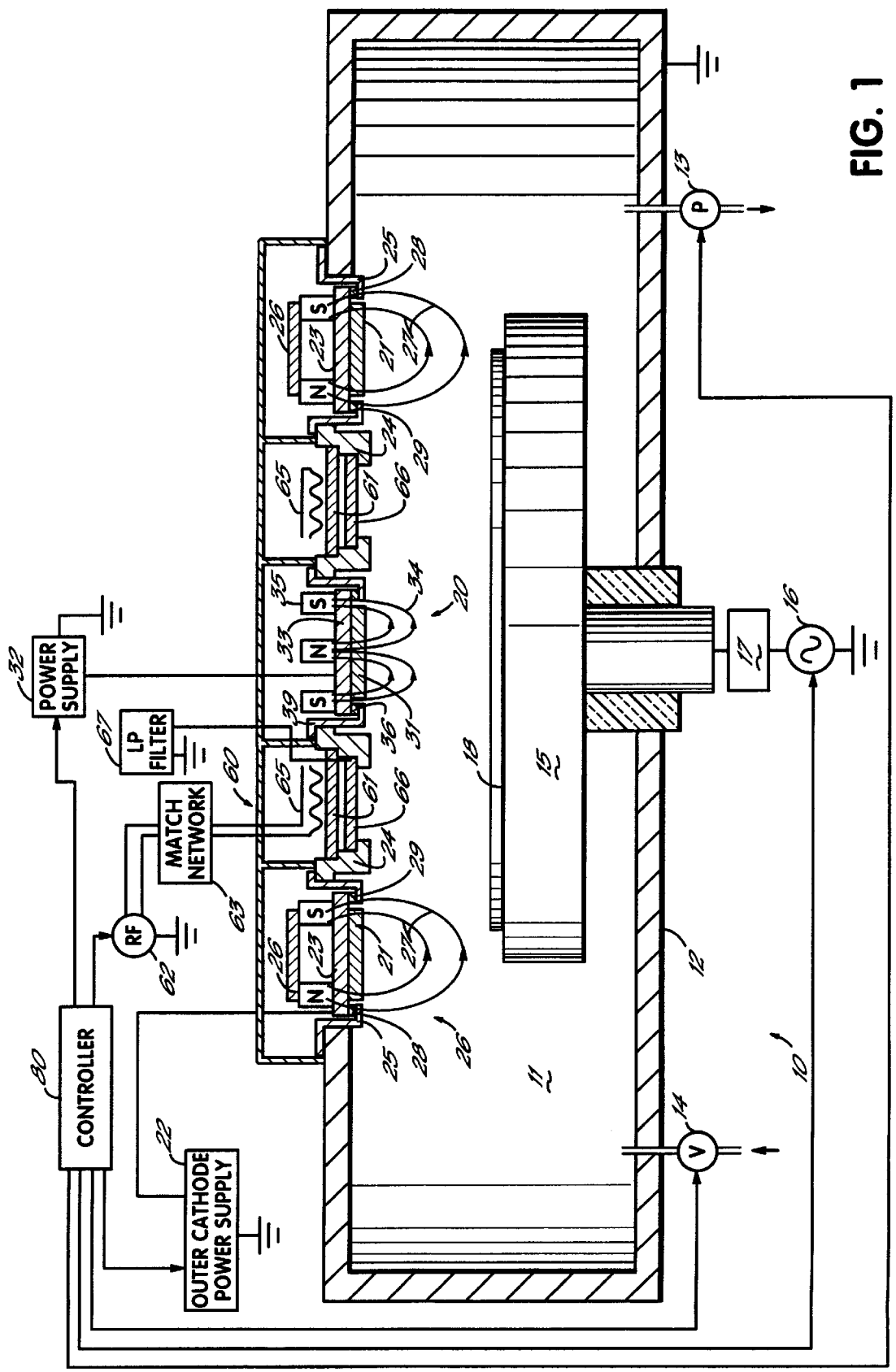
FIG. 1 is a cross-sectional diagram illustrating an IPVD apparatus according to one preferred embodiment of the present invention.

An IPVD sputtering apparatus 10 according to a preferred embodiment of the present invention is illustrated diagrammatically in FIG. 1. The IPVD apparatus 10 includes a vacuum chamber 11 bounded by a chamber wall 12. The chamber 11 is provided with a vacuum pumping system 13 for evacuation of the chamber 11 to high vacuum and a supply gas control valve 14 which vents into the chamber 11 process gas, including an inert gas such as argon, for use in physical sputtering, or including reactive gases for use in reactive sputtering applications. A system for loading and unloading wafers for processing (not shown) is also provided.

At one end of the chamber 11 is situated a wafer holder 15 to which an RF generator 16 is connected through a matching network 17 for application of RF-generated negative bias on the substrate or wafer holder 15 and to a wafer 18 supported thereon for processing. A large opening is provided in the wall 12 at the opposite end of the chamber 11 from the wafer support or holder 15. This opening is sealed by a source arrangement that includes a cathode and electrode assembly 20. The support 15 is preferably axially moveable relative to a cathode and electrode assembly 20 so that the spacing between targets on the cathode and electrode assembly 20 can be adjusted relative to the wafer 18 on the support 15 both initially and during the target life, primarily to maintain desired uniformity as the targets erode. Where such an adjustable support is provided, a seal in the form of a metal bellows (not shown), for example, may be provided between the mount of the support 15 and the wall 12 of the chamber 11. The geometry of the chamber 11, particularly the location of the sides of the chamber wall 11 with respect to the outer edge of the wafer 18, has an effect on the uniformity of the deposition. The effect is greater where the walls 12 are close to the wafer, so that wide spacing of the sides of the wall 12 from the wafer 18 is preferably maintained. Accordingly, the geometry of the chamber 11 is empirically configured in relation to other parameters of the process to optimize deposition uniformity and other properties of the film being deposited.

Figure 2:
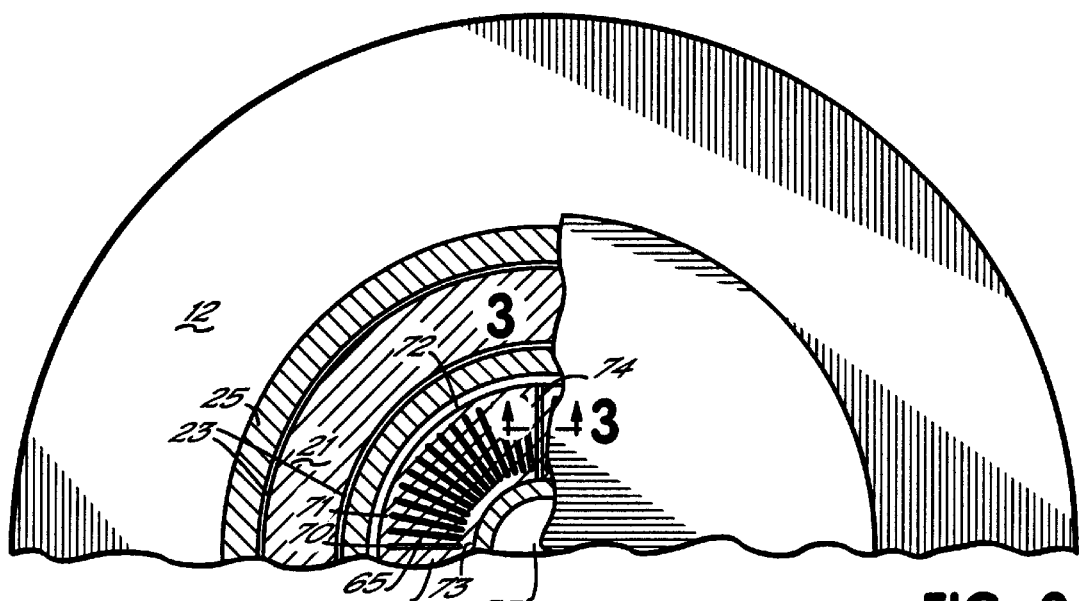
FIG. 2 is a plan view illustrating the cathode and electrode assembly of the IPVD apparatus of FIG. 1.

As further shown in FIGS. 1 and 2, the assembly 20 includes a generally annular target 21 shown on a backing plate 23, which in operation, is energized to a negative potential by a cathode power supply 22. The power supply 22 is, preferably, in the form of a DC power supply or a pulsed DC power supply for metal deposition, but may be an RF supply connected to the target 21 through a suitable matching network (not shown). The erosion of the target 21 is controlled by inner and outer dark space rings 24,25 and, preferably, also by magnetic fields 27 generated by a magnetron magnet assembly 26. Cooling of the target 21 is achieved by the use of internal water channels (not shown) or by a suitable external cooling system (not shown), which are conventional. The target 21 is electrically isolated from the electrically grounded surfaces of the apparatus 10 by insulators 28 and 29.

The assembly 20 also includes a generally circular target 31, shown on a target backing plate 33. In operation, the target 31 is charged negatively by a cathode power supply 32 similar to power supply 22, but which is controllable independently of the power supply 22. The erosion of the target 31 is controlled by an annular dark space shield 39 and, preferably, also by a magnetic field 34 generated by a magnetron magnet assembly 35. Cooling (not shown) of the target 31 is also provided. The target 31 is electrically isolated from electrically grounded surfaces of the apparatus 10 by annular insulator 36. The inner circular target 31 is concentric with the annular outer target 21.

Between the outer annular target 21 and the inner circular target 31 is mounted an RF plasma excitation system 60. The RF excitation system 60 may be implemented in a number of ways. One preferred embodiment is that illustrated, in which the plasma excitation system 60 includes a plane annular dielectric window 61 which seals the annular opening in the wall 12 of the chamber 11 between the targets 21 and 31. The side of the window 61 that is facing the substrate holder 15 is in contact with the vacuum of the chamber 11 while the opposite side or outer face of the window 61 is in contact with a nominally atmospheric environment. Near the outer face of the window 61 is an excitation coil 65 which preferably extends in a direction generally parallel to the window 61 and may be planar or substantially planar. Suitable coils 65 can be adapted from coils, for example, as described in U.S. Pat. No. 4,948,458 granted to Ogle and in U.S. Pat. No. 5,669,975 granted to Ashtiani, both hereby expressly incorporated by reference herein.

The coil 65 is energized by an RF power supply 62 to which it is connected through a matching network 63.

On the interior side of the window 61 is a shield 66, which is a combination Faraday shield and physical shield. As a Faraday shield, the shield 66 permits RF energy from the coil 65 to couple into the chamber 11 without capacitively shielding the chamber 11 from the coil 65. As a physical shield, the shield 66 prevents coating material, which may be metal and electrically conductive, from depositing onto the window 61. The shield 66 is mounted a small distance from the window, close to the inside surface of the dielectric window 61. The shield 66 is preferably slotted and may be electrically grounded to, and maintained in, good thermal contact with the dark space shields 24 and 25, which are preferably water cooled. Alternatively, the shield 66 may be electrically floating, at least with respect to RF energy on the coil 65, as, for example, by being grounded through a low pass filter 67. In the preferred embodiment, the shield 66 is cooled by conduction from the edges, either to the dark space shield 25 which is water-cooled, or through an optional electrically insulating and thermally conductive supporting ring (not shown) that would allow cooling of the shield 66 while electrically insulating the shield 66 from the dark space shield 25, if desired. Other shield cooling techniques and arrangements of shields can be employed.

In operation, an RF voltage is supplied by the power supply 62 through matching network 21 to the excitation coil 65. Techniques for design of the matching unit and certain connections for minimizing undesirable capacitive coupling to the shield 66 are described in U.S. Pat. No. 5,669,975 to Ashtiani. Process gases are supplied to raise the pressure in the chamber to a pressure of from about 1 to about 100 mTorr, usually in the 1–40 mTorr range. A high density plasma can then be ignited in the chamber. DC or RF power is supplied to the sputtering targets 21 and 31, which is eroded by ion bombardment from the main plasma. The material sputtered from the target by the main plasma is ionized as it passes through the high density plasma supported by the inductively coupled energy from the coil 65.

A negative bias is applied to the substrate 18 from an RF source 16 through a matching network 17 to electrostatically attract and steer positive ions of sputtering material from the plasma onto the substrate 18 in a direction nearly perpendicular to the substrate 18. The bias energy source 16 employs RF energy or other form of electrical energy that is effective to cause a potential to develop on the substrate that is sufficiently negative relative to the potential of the plasma to attract positive ions of sputtered material from the plasma toward the substrate 18 so that they preferably impinge upon the substrate 18 at or nearly at right angles to the surface, thereby enabling the coating of the bottoms of high aspect ratio features on the substrate 12. For deposition, the bias potential on the substrate 12 should not be so high as to attract the ions onto the substrate at energies that are high enough to substantially etch or otherwise damage the films or the devices being formed on the substrate 12.

Figure 3:
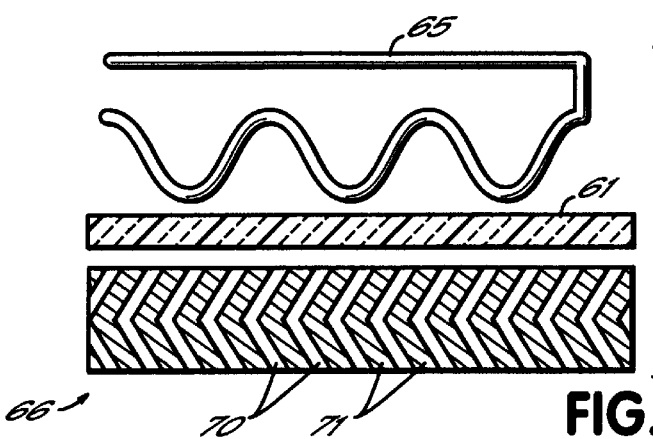
FIG. 3 is a cross-sectional view of the shield of a cathode and electrode assembly of FIG. 2 taken along the line 3—3 of FIG. 2.

As illustrated in FIGS. 2 and 3, the shield 66 is provided with an array of radially oriented slots 70 therethrough that divide the shield 66 into an array of radially disposed fins 71 connected at their inner and outer edges by narrow circumferential rims 72,73. The circumferential extent of the rims 72,73 is interrupted at one slot 74 which extends the entire transverse radial extent of the shield 66 at one angular position on the circumference of the shield 66. The interruption of the rims 72,73 prevents the formation of a circumferential current path in the shield 66 that would short out coupled fields from the coil 65 and thereby reduce the coupling of energy from the coil 65 to the plasma within the chamber 11. The plurality of slots 71 prevent the induction of eddy currents in the shield that would also reduce coupling of energy from the coil 65 to the plasma.

As illustrated in FIG. 3, the slots 71 are preferably provided with an angular bend or other configuration that will block direct paths for the coating material to pass through the slots 71 of the shield 66 from the processing space within the chamber 11 and onto the window 61, Such coating on the window 61, if it were allowed to deposit, would coat the window with conductive film and electrically shield the plasma from the coil 65, reducing or eliminating the coupling of RF energy to form the plasma. The slots 70 of the shield 66 of FIG. 3 are formed by any suitable method, such as by casting, by milling a plate from opposite sides or by electric discharge machining (EDM).

Figure 3A:
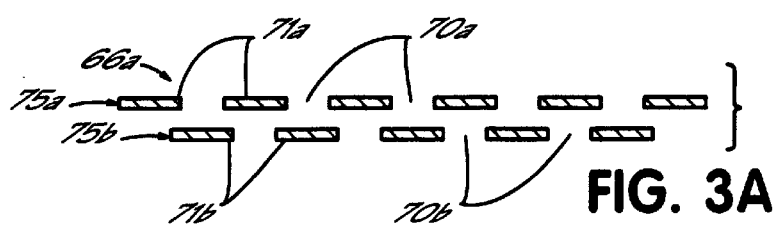
FIG. 3A is a cross-sectional view, similar to FIG. 3, illustrating an alternative embodiment of the shield of the cathode and electrode assembly.

FIG. 3A illustrates an alternative shield 66a, which is formed of two layers or plates 75a, 75b, each having respective arrays of slots 70a, 70b therein and intervening fins 71a, 71b, each interconnected at their inner and outer edges by respective inner and outer rims (not shown). The slots 70a are staggered in relation to the slots 70b so that the fins 71a and 71b interrupt direct paths for coating material from the processing space of the chamber 11 to the window 61.

An advantage of locating the plasma excitation system at an opening in the center of an annular target or other ring-shaped source is that dimensional constraints imposed by the need to interpose helical coils concentrically around an axis between the center of the sputtering source and the center of the wafer are eliminated. A further advantage is that benefits arise from the use of the annular target or ring-like source, which enhances film uniformity at a greater target to wafer separation than in the case of a flat solid planar source. The ability to achieve uniformity at greater target-to-substrate distance allows more opportunity for ionization of the sputtered material. When ring-shaped sources have been used with sputter coating devices of the prior art, such devices usually required special shielding in the central region of the source to prevent the redeposition of sputtered material at this region. In such a case, heating of this central region often was necessary to ensure good adhesion of this material and to prevent flaking off of the deposited material, which would increase particulate contamination of the chamber. In embodiments of the present invention, the central opening of the ring-shaped source is used as a location for equipment used to excite a high density plasma and so becomes a useful part of the system rather than a liability by contributing to the ionization of sputtered material for directional deposition onto the substrate.

A further advantage arising from various embodiments of the present invention is that the cathode and the secondary plasma exciting structure can be made more compact than in the prior art and does not require extra feed-through or other modifications to the process vacuum chamber, making it practical to fit the source to existing modules.

An advantage of providing the two part target, particularly one that includes the annular target ring 21 and the inner target circular disc 31, is that higher deposition rates can be achieved and greater uniformity of deposited film realized. By providing a controller 80 through which the relative powers and other operating parameters of the two targets 21 and 31 can be controlled differently, the uniformity of coating material on the substrate can be precisely maintained. With a cathode according to the present invention, greater freedom of design choice in configuring the processing chamber is provided which enables the optimizing of the IPVD process. The use of the inner and outer target according to the present invention overcomes the difficulties of the prior art and provides uniform film coverage on substrates having sub-micron sized high aspect ratio features thereon. In particular, the present invention achieves higher deposition rates, better flat field uniformity and more uniform step coverage on recessed features than systems of the prior art. These benefits allow the source to be conveniently used for flat field depositions as well as for step coverage and fill depositions.

Those skilled in the art will appreciate that the implementation of the present invention herein can be varied, and that the invention is described in preferred embodiments. Accordingly, additions and modifications can be made without departing from the principles and intentions of the invention.

What is claimed is:

1. An ionized physical vapor deposition apparatus comprising:
   a vacuum chamber having a chamber wall surrounding a vacuum processing space inside of the chamber;
   a source of coating material from which coating material is supplied to the processing space, the source including a ring-shaped component having a central opening and at least one surface in communication with the vacuum processing space and a central component situated in the central opening and concentric with the ring-shaped component;
   the chamber wall having a dielectric window therein at the central opening of the ring-shaped component of the source;
   a substrate support inside of the chamber opposite the processing space from the source;
   an RF energy source outside of the chamber;
   a coil outside of the chamber adjacent the window and connected to the RF energy source to inductively couple energy through the window and into the chamber to form an inductively coupled plasma in the processing space that is sufficiently dense to ionize coating material moving from the source through the processing space; and
   shield structure inside of the chamber between the window and the processing space, the shield being configured to permit the effective coupling of RF energy from the coil into the processing space and to physically shield the window from coating material from the processing space.

2. The apparatus of claim 1 wherein the components of the source are sputtering targets; and the apparatus further comprises:
   a target power supply connected to each component of the source to supply a DC potential to the sputtering targets that is sufficiently electrically negative relative to the plasma to sputter material from the target into the processing space, the power supply being operable to separately control the power to each of the components.

3. The apparatus of claim 1 further comprising:
   a bias power supply connected to the substrate support so as to produce a DC potential on a substrate on the support that is sufficiently negative relative to the plasma to attract positive ions of coating material from the processing space toward the substrate.

4. The apparatus of claim 1 wherein:
   the ring-shaped component of the source includes at least one annular sputtering target of electrically conductive coating material having a sputtering surface in communication with the inside of the chamber; and
   the central component of the source includes at least one circular sputtering target of the same coating material as the ring-shaped source and having a sputtering surface in communication with the inside of the chamber.

5. The apparatus of claim 4 further comprising:
   a magnetron magnet behind each target outside of the chamber effective to confine a sputtering plasma in close proximity to the sputtering surfaces of the targets.

6. The apparatus of claim 4 wherein:
   the components of the source include at least one flat annular sputtering target and at least one circular target having a sputtering surface lying approximately in a plane that is substantially parallel to a substrate on the support.

7. The apparatus of claim 1 wherein:
   the shield structure includes a slotted annular disc of electrically conductive material.

8. The apparatus of claim 1 wherein:
   the shield structure includes a slotted annular disc of electrically conductive material having a high RF impedance to ground.

9. An ionized physical vapor deposition apparatus comprising:
   a vacuum chamber having a chamber wall surrounding a vacuum processing space inside of the chamber;
   a substrate support in the chamber at one end of the processing space;
   an annular sputtering target of coating material opposite the processing space from the substrate support and having a central opening therein and a substantially flat ring-shaped sputtering surface facing the substrate support;
   a circular target of coating material situated in the central opening concentric with the annular sputtering target;
   at least one target power supply connected to the targets to supply to each a DC potential that is sufficiently negative to sputter material from the sputtering surface of the target into the processing space and toward the substrate support;
   a magnetron magnet assembly behind the targets outside of the chamber effective to generate a magnetic field over each target, including a field around the ring-shaped sputtering surface and surrounding the central opening of the target so as to confine a sputtering plasma in close proximity to the sputtering surface of the annular target;
   an RF energy source outside the chamber;
   an RF electrode proximate the central opening and connected to the RF energy source to reactively couple energy into the chamber to form a reactively coupled plasma in the processing space that is sufficiently dense to ionize coating material from the targets in the processing space; and
   the substrate support being provided with a source of DC potential that is sufficiently negative to attract positive ions of coating material from the processing space toward the substrate without damaging the substrate.

10. The apparatus of claim 9 wherein:
    the chamber wall includes a dielectric window at the central opening of the annular target;
    the RF electrode indudes a coil outside the chamber adjacent the window and connected to the RF energy source to inductively couple energy through the window and into the chamber to form an inductively coupled plasma in the processing space that is sufficiently dense to ionize coating material from the annular target in the processing space; and the apparatus further comprises shield structure inside of the window between the window and the processing space and configured to permit the effective coupling of RF energy from the coil into the processing space and to physically shield the window from coating material from the processing space.

11. The apparatus of claim 10 wherein:

the dielectric window is a generally planar window lying within the central opening of the annular target; and the coil is situated behind the window and has at least a portion thereof generally parallel to the window.

12. The apparatus of claim 10 wherein:

the shield structure includes a slotted sheet of conductive material having a high RF impedance to ground.

13. The apparatus of claim 9 wherein:

at least one target power supply is provided with separately controllable outputs for the separate control of power levels to the annular and circular targets.

14. A physical vapor deposition method comprising:

supporting a substrate on a substrate support in at one end of a processing space in a vacuum processing chamber;

providing a target of coating material having an inner component and an outer component and situated at an end of the chamber opposite the processing space from the substrate support, the inner component of the target being situated in a central opening of the outer component and concentric therewith;

separately energizing the components of the target to sputter material from the inner and outer components of the target to control the distribution of material at the substrate;

coupling RF energy from an RF source into the chamber through a dielectric window between the inner and outer components of the target from a coil positioned outside of the window, and forming a dense plasma in the processing space and ionizing with the plasma material sputtered from the targets; and electrically directing the ionized sputtered material onto the substrate to deposit a film thereon on the substrate.

15. The method of claim 14 wherein:

the providing of the target includes providing a target having a circular inner component and an annular outer component concentric with the central component and defining an annular opening therebetween; and the coupling of RF energy includes coupling the RF energy from the source into the chamber through an annular dielectric window.

16. The method of claim 14 wherein:

the energizing of the target components includes adjusting the relative powers to the respective components of the target to control the relative distribution of material sputtered from the inner and outer targets.

17. The method of claim 14 wherein:

the energizing of the target components includes adjusting the relative powers to the respective components of the target to control the distribution of material on the substrate.

* * * * *

UNITED STATES PATENT AND TRADEMARK OFFICE
CERTIFICATE OF CORRECTION

PATENT NO. : 6,197,165 B1
DATED : March 6, 2001
INVENTOR(S) : Drewery et al.

Page 1 of 1

It is certified that error appears in the above-identified patent and that said Letters Patent is hereby corrected as shown below:

Column 6,
Line 63, sentence beginning with "The coil 65 is energized" should not start a new paragraph.

Column 7,
Line 8, reads "slofted" and should read -- slotted --.
Line 23, reads "network 21 to" and should read -- network 63 to --.
Lines 48, 49, and 50, read "substrate 12" and should read -- substrate 18 --.

Signed and Sealed this

Twenty-second Day of January, 2002

Attest:

Attesting Officer

JAMES E. ROGAN
*Director of the United States Patent and Trademark Office*